United States Patent
Sugasawara

[19]

[11] Patent Number: 6,043,539
[45] Date of Patent: Mar. 28, 2000

[54] ELECTRO-STATIC DISCHARGE PROTECTION OF CMOS INTEGRATED CIRCUITS

[75] Inventor: Emery Sugasawara, Pleasanton, Calif.

[73] Assignee: LSI Logic Corporation, Milpitas, Calif.

[21] Appl. No.: 08/978,979

[22] Filed: Nov. 26, 1997

[51] Int. Cl.[7] .............................. H01L 23/60; H01L 23/62
[52] U.S. Cl. ...................... 257/357; 257/355; 257/786; 361/220
[58] Field of Search ...................... 257/355, 356, 257/357, 786; 361/56, 57, 90, 93, 100, 101, 220

[56] References Cited

U.S. PATENT DOCUMENTS

| | | | |
|---|---|---|---|
| 5,410,254 | 4/1995 | Consiglio | 324/456 |
| 5,712,753 | 1/1998 | Yeh et al. | 361/56 |
| 5,715,127 | 2/1998 | Yu | 361/56 |
| 5,818,086 | 10/1998 | Lin et al. | 257/355 |

FOREIGN PATENT DOCUMENTS 62-230028  10/1987  Japan ................................. 257/786

OTHER PUBLICATIONS

Matsumoto, et al., "New Failure Mechanism due to Non-Wired Pin ESD Stressing," EOS/ESD Symposium, 1994, pp. 2.5.1–2.5.6.

Primary Examiner—John Guay

[57] ABSTRACT

In a semiconductor integrated circuit, I/O buffer circuits that include ESD protection are generally provided for each I/O pad. According to the invention, unused pads, i.e. pads that are not connected to core circuitry according to an initial design, are connected to other pads that are used for connection to the core circuitry, thereby employing the unused pads to improve ESD protection of susceptible pads. This approach has the advantages of greater ESD protection without increasing silicon area and without adding any additional steps to the usual fabrication process. The inventive concept is especially useful for augmenting ESD protection of corner pads without requiring new or custom ESD protection circuits. This invention can be easily implemented into known layout tools.

15 Claims, 2 Drawing Sheets

ELECTRO-STATIC DISCHARGE PROTECTION OF CMOS INTEGRATED CIRCUITS

FIELD OF THE INVENTION

The present invention is related to ESD protection in integrated circuits and, more specifically, methods and apparatus for improved ESD protection in CMOS integrated circuits.

BACKGROUND OF THE INVENTION

Semiconductor integrated circuits are quickly destroyed when subjected to excessive voltages. One of the most common causes of damage is electrostatic discharge or ESD. An ESD event occurs whenever a packaged IC is subjected to the dissipation of static electricity, which may occur whenever the pins of the IC come into contact with another surface. Thus, the likelihood of an ESD event damaging or destroying an IC is substantial during packaging and handling of the IC. Even after an integrated circuit is mounted on a circuit board and housed within a system, such as a modem or PC, it is nonetheless susceptible to ESD events discharging in and around the circuitry.

The human body is a major source of static charge. It is sometimes modeled as a 100 picofarad capacitor, capable of storing two or three kilovolts and having a series resistance on the order of a few K-ohms. Thus, when the pins of a packaged integrated circuit are touched by a person, a peak current on the order of two amperes can be delivered through the MOS devices on the IC. These voltages and currents can easily damage or destroy the gate oxides of modern MOS devices on the IC which have sub-micron geometries. To address this problem, most ICs are provided with some sort of ESD protection scheme.

Frequently, ESD protection schemes comprise one or more diodes or SCR circuits coupled between each input/output (I/O) pad on the chip, and the power supply rails. When an excessive voltage appears at the corresponding pin, for example an ESD event, the diode, SCR or similar circuitry turns on very quickly, to short the high voltage to the power supply node. For example, U.S. Pat. Nos. 4,829,350; 4,811,155; 4,855,620; and 4,692,834 all disclose ESD protection circuits in which the channel of an MOS device is coupled between ground and a pin of the IC. Such an MOS device has a parasitic bipolar transistor coupled in parallel with the MOS device. When a positive ESD event occurs at the pin, the bipolar transistor is forward-activated, and a substantial portion of the ESD current is passed through it to ground. An electrostatic discharge protection circuit having a non-lightly doped drain MOS device for protecting other lightly doped drain devices is disclosed in U.S. Pat. No. 5,246,872. A method for forming a silicon-controlled rectifier (SCR) in a semiconductor integrated circuit is described in U.S. Pat. No. 5,369,041. Another CMOS on-chip ESD protection circuit and related semiconductor structure are shown in U.S. Pat. No. 5,182,220.

Typically, the IC "chip" or die includes an I/O "slot" adjacent each bonding pad. Each slot is simply a predetermined area in which a selected I/O circuit, such as a buffer circuit, is formed when the rest of the chip is fabricated. Standard buffer circuits or "cells" are inserted from a cell library as needed. These buffer circuits generally include an ESD protection structure, as noted, but in any event the buffer must fit within the standard slot size. Since the level of ESD protection or immunity depends upon silicon area of the protection structure, the level of protection is limited by the I/O slot size on the die. This level of protection is often inadequate.

Moreover, the present inventor has observed that corner pins of an IC are adversely affected by ESD more often than the other pins. This is apparently due to the tendency of a high-voltage discharge to concentrate at the corners of the package. What is needed therefore is to improve ESD immunity in integrated circuits, without increasing silicon area dedicated to the task. What is also needed is to improve immunity particularly at corner pins, again without increasing silicon area.

SUMMARY OF THE INVENTION

In view of the foregoing background, one aspect of the invention is embodied in a semiconductor integrated circuit product. Such an IC product includes a circuit chip or die containing core electronic circuitry and having a plurality of I/O pads, at least one of the pads being used for electrical connection to the core electronic circuitry and at least another one of the pads being unused. At least two buffer structures are formed on the circuit chip (as in prior art), one of the buffer structures being connected to the used one of the pads and the other buffer structure being connected to the unused one of the pads. The buffer structures each includes an ESD protection structure for protecting core electronic circuitry connected to the corresponding pad from excessive voltage appearing at a corresponding external pin. Finally, a conductor is formed on the IC interconnecting the used pad and the unused pad, thereby interconnecting the corresponding buffer structures to one another in parallel so as to improve ESD protection of the core circuitry connected to the used pad. In one example of such a product, the plurality of pads are located along a peripheral edge of the chip; and the used pad and the unused pad are located adjacent one another along the peripheral edge of the chip. In another example, the chip includes pads arranged along generally rectilinear edges of the chip including first and second adjacent edges forming a corner of the chip; and the used pad is located adjacent the corner of the chip. In this way, additional protection is provided for the corner pad.

According to another aspect of the invention, a method of improving ESD protection of core circuitry connected to a first I/O pad in a semiconductor integrated circuit comprises providing a buffer circuit having an ESD protection structure connected to the first I/O pad; identifying an unused pad on the IC that is not connected to the core circuity but includes an ESD protection structure connected to the pad; and electrically connecting the unused pad to the first pad, thereby connecting the corresponding ESD protection structures to each other in parallel, so that improved ESD protection is provided to the first I/O pad without adding additional circuitry to the chip. Typically the connection would be provided by a metallization layer formed within the usual fabrication process.

Still another aspect of the invention can be summarized as an improved method of designing an ASIC for improved ESD immunity. It is assumed the ASIC includes an array of I/O pads generally for connecting core circuitry to external package pins, each I/O pad including an I/O buffer, and each I/O buffer including an ESD protection structure. The improved method calls for first obtaining an initial design of the ASIC including a specification of I/O connections; determining which of the I/O pads in the array are not used for connection to the core circuitry according to the initial design; and then modifying the initial design so as to provide interconnection of at least one of the unused pads to a selected pad in the array that is used for connection to the core circuitry, thereby enhancing ESD protection of the core circuitry connected to the selected pad. The method is advantageously utilized especially where the selected pad is adjacent a corner of the ASIC chip.

The foregoing and other objects, features and advantages of the invention will become more readily apparent from the following detailed description of a preferred embodiment which proceeds with reference to the drawings.

DETAILED DESCRIPTION OF A PREFERRED EMBODIMENT

Figure 1:
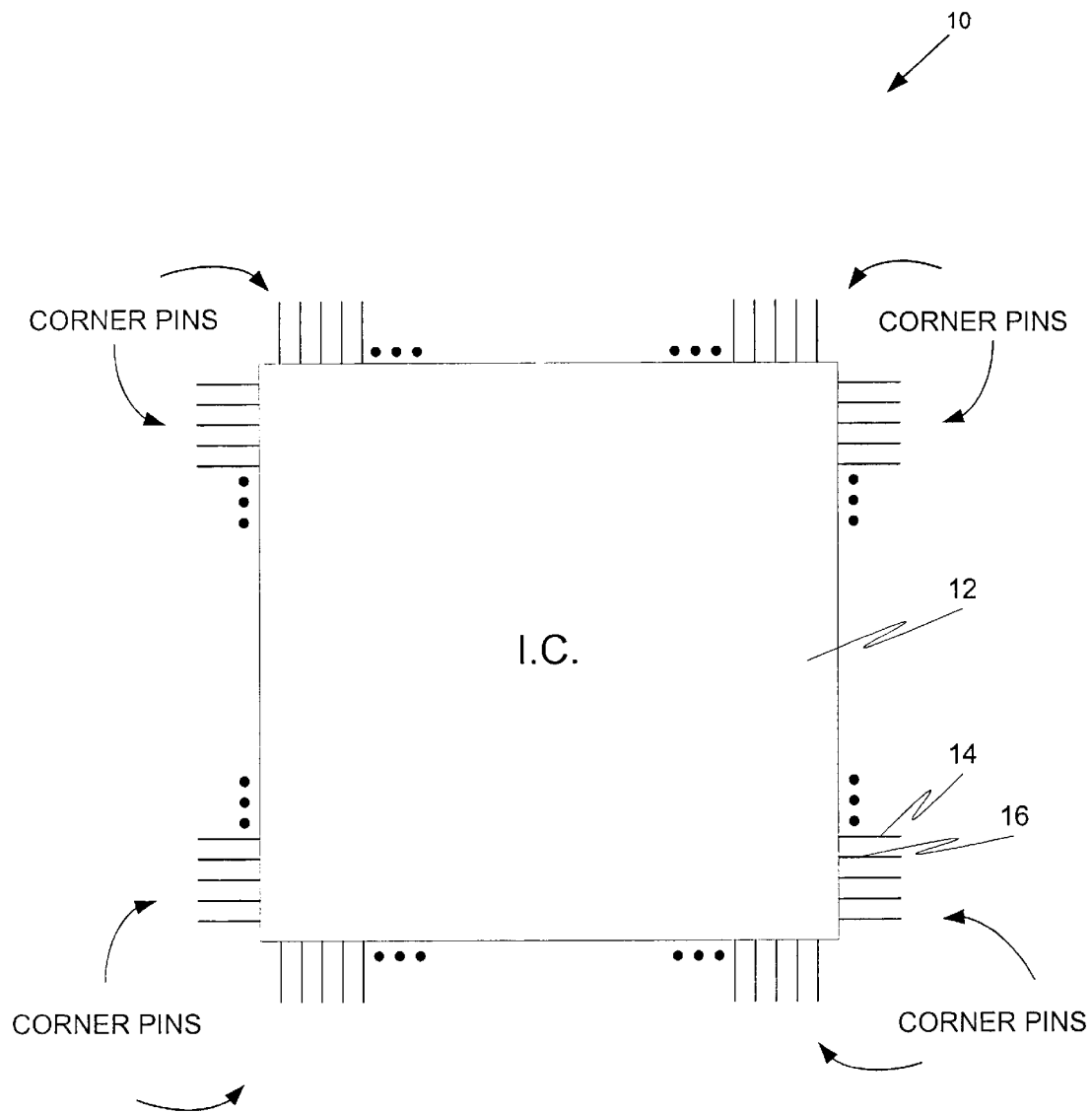
FIG. 1 is a top plan view of a packaged integrated circuit product.

FIG. 1 is a top plan view of a typical integrated circuit product. By "product" we mean that the integrated circuit chip is packaged and ready for shipment to a customer. The product 10 thus includes an integrated circuit chip (not shown) housed in packaging material 12 such as a polymeric material. The package 12 includes a plurality of pins, for example pins 14 and 16 extending outwardly around the periphery of the package according to one of various industry standard pin configurations. The pins are arranged for insertion into a corresponding socket, or surface mounting, for connecting the product 10 to other electronic circuitry. As is known in the prior art, many of the pins are electrically connected via bonding wires to I/O pads on the integrated circuit die. Other pins are connected to power and ground planes which in turn are connected to corresponding power and ground pads on the die. Finally, FIG. 1 points out corner pins on the IC package. As noted previously, circuitry connected to corner pins tend to be more susceptible to ESD events as the high voltage discharge is concentrated toward the corners of the package. By "corner pins" we mean not only the pins immediately adjacent to the corner of the package (two pins at each corner, oriented orthogonally), but also including additional pins which are nearby but not immediately adjacent to the corners of the package.

Figure 2:
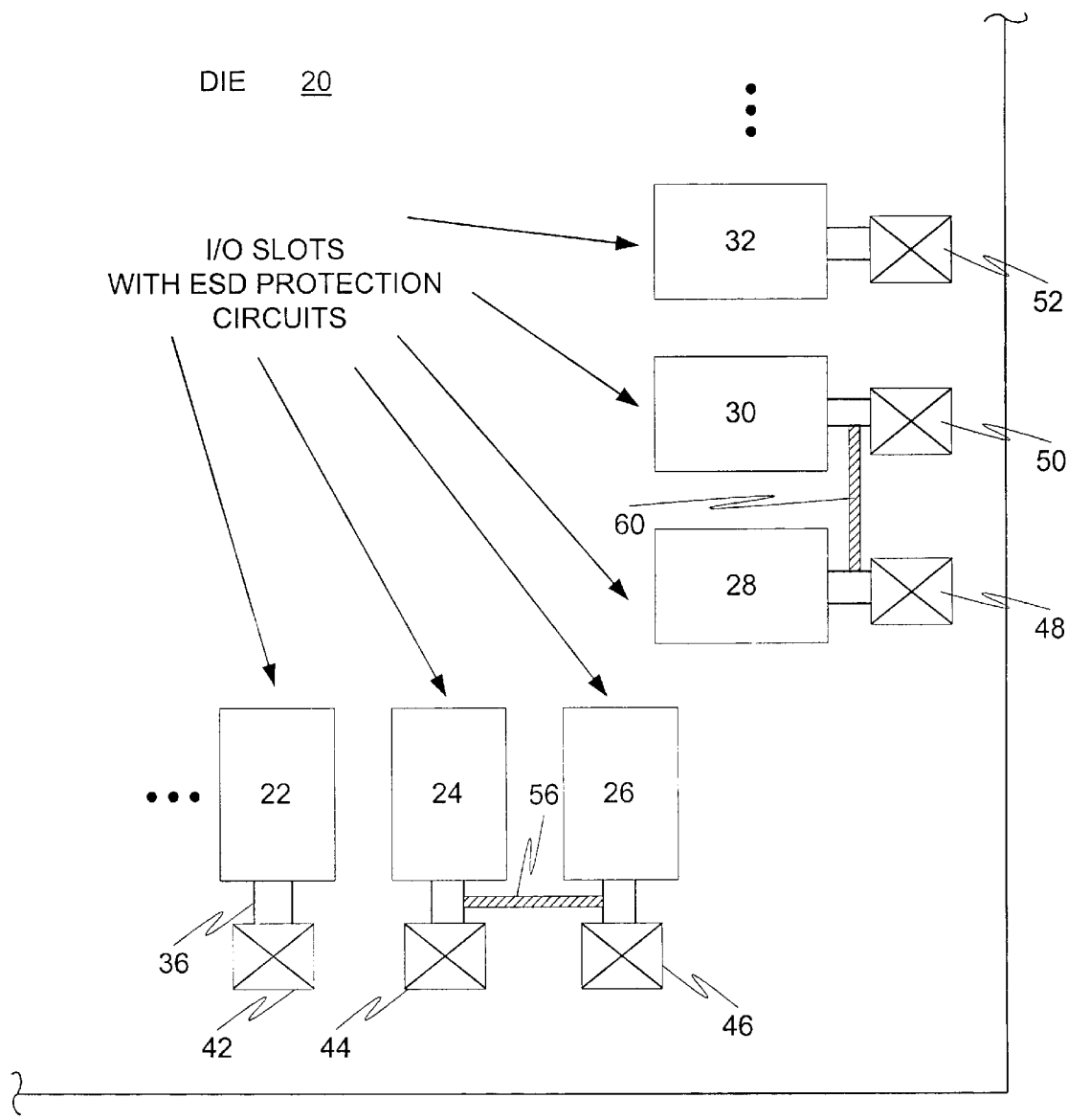
FIG. 2 is an enlarged, top plan view of a corner region of an integrated circuit die illustrating one illustrative embodiment of the present invention.

FIG. 2 is an enlarged, top plan view of a corner region of an integrated circuit chip or die 20 illustrating one embodiment of the invention. The chip 20 includes a plurality of I/O slots 22, 24, 26, 28, 30 and 32. As described in the Background, each of the I/O slots has a predetermined, fixed size, for forming an I/O circuit, such as an I/O buffer circuit. Each I/O slot buffer circuit is connected via a corresponding conductor, for example conductor 36, to a corresponding bonding pad 42, 44, 46, 48, 50 and 52, respectively. According to the prior art, all of the I/O slots are of a consistent size, and thus no special consideration is given to enhancing ESD protection for any particular bonding pad.

In the die 20, some of the bonding pads, namely 44 and 50, are unused in the sense that they are not connected to internal core circuitry on the chip. Nonetheless, the corresponding I/O slots 24, 30 include ESD protection circuits as they are generally provided for all I/O pads regardless of whether the pads are used or not. According to the invention, these unused buffer circuits, which include ESD protection structures, are employed to include ESD protection of circuitry connected to other I/O pads that are used. So, by way of illustration, a conductive material, typically metal, is formed so as to interconnect a used pad and an unused pad, thereby interconnecting the corresponding buffer structures to one another in parallel, so as to improve ESD protection of the core circuitry connected to the unused pad. Thus, in FIG. 2, a conductor 56 is provided for interconnecting the used pad 46 to the unused pad 44. Similarly, another conductor 60 is provided so as to interconnect the used pad 48 to the unused pad 50. As a result, the used pads 46 and 48 enjoy increased ESD protection by way of the ESD protection structures provided in buffer circuits 24 and 30, respectively. This provides improved ESD immunity at the corner pads which are most susceptible. This invention is useful for any IC design, but is especially beneficial for "core-limited" designs in that no additional I/O circuitry is needed, nor is additional silicon area required. In "corelimited" designs, there are extra I/O pads (and buffer circuits) that are available. Since the ESD protection is increased as the amount of "area" that an ESD charge "sees" during electrostatic discharge through a pin, any increase in the area improves the protection. The present invention is expected to nominally double the protection by essentially providing two ESD protection structures in parallel.

The invention is not limited to protection of corner pins. It can just as well be applied to increase protection of pins anywhere in the package. Moreover, the inventive concept is not limited to connecting a single unused pad to a used pad. More than one unused pad can be connected to a used pad for even further protection. Preferably, unused pads are connected to neighboring used pads for this purpose. However, in some applications, it may be necessary to interconnect pads that are not immediately adjacent. The connections described, e.g., 56 and 60, are provided during the metalization step of the usual fabrication process. Thus, no changes to the standard IC fabrication process are required. The invention is applicable to a wide array of integrated circuits, particularly CMOS circuits, and including Application Specific Integrated Circuits ("ASIC") as well as full custom designs.

To summarize, the present invention provides additional ESD protection without occupying additional silicon real estate, without requiring new or special ESD structures for corner pins or other more susceptible pins. Moreover, the present invention can be easily implemented into existing layout tools.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A semiconductor integrated circuit product comprising:
    a circuit chip containing core electronic circuitry and having at least first and second I/O pads;
    at least two buffer structures formed on the circuit chip, one of the buffer structures being connected to the first pad and the other buffer structure being connected to the second pad;
    the buffer structures each including an ESD protection structure for protecting core electronic circuitry connected to the corresponding pad from excessive voltage appearing at a corresponding external pin; and
    a conductor interconnecting the first pad and the second pad, thereby interconnecting the corresponding buffer structures to one another in parallel so as to improve ESD protection of the core circuitry connected to the first pad,
    wherein the first pad is directly coupled with the core electronic circuitry and the second pad is coupled with the core electronic circuitry only through the conductor.

2. A semiconductor integrated circuit product according to claim 1, wherein:

the pads are located along a first peripheral edge of the chip; and the first pad and the second pad are located adjacent one another along the first peripheral edge of the chip.

3. A semiconductor integrated circuit product according to claim 1, wherein:

the chip includes pads arranged along generally rectilinear edges of the chip including first and second adjacent edges forming a corner of the chip; and the first pad is located adjacent the corner of the chip.

4. A semiconductor integrated circuit product according to claim 1, further comprising a second conductor interconnecting the first pad and a third pad of the circuit chip, thereby interconnecting the corresponding buffer structures to one another in parallel so as to further improve ESD protection of the core circuitry connected to the first pad, wherein the third pad is coupled with the core electronic circuitry only through the second conductor.

5. A semiconductor integrated circuit product according to claim 1, wherein:

the product is an ASIC product; and each of the buffer structures is a standard cell buffer circuit.

6. A semiconductor integrated circuit product according to claim 1, wherein the conductor comprises a metallization strap extending between the second pad and the first pad.

7. A method of improving ESD protection of core circuitry connected to a first I/O pad in a semiconductor integrated circuit, the method comprising the steps of:

providing a buffer circuit having an ESD protection structure connected to the first I/O pad;

identifying an unused pad on the IC that is not connected to the core circuity but includes an ESD protection structure connected to the pad; and electrically connecting the unused pad to the first pad, thereby connecting the corresponding ESD protection structures to each other in parallel, so that improved ESD protection is provided to the first I/O pad without adding additional circuitry to the chip.

8. A method according to claim 7 wherein said connecting step comprises forming a conductive structure between the used pad and the unused pad as part of a metallization step in which other conductive structures are formed interconnecting one or more of the pads to the core circuitry whereby no special fabrication step is necessary to employ the unused buffer structures.

9. A method according to claim 7 wherein the identifying step comprises identifying an unused pad immediately adjacent to the first pad.

10. A method according to claim 7 wherein the identifying step comprises first identifying an I/O pad susceptible to ESD damage and designating the susceptible pad as the first pad; and then identifying the unused pad as an unused pad nearest to the first pad.

11. A method of designing an ASIC for improved ESD immunity, the ASIC including an array of I/O pads generally for connecting core circuitry to external package pins, each I/O pad including a standard I/O buffer, and each I/O buffer including an ESD protection structure, the method comprising the steps of: obtaining an initial design of the ASIC including I/O connections;

determining which of the I/O pads in the array are not used for connection to the core circuitry according to the initial design; and modifying the initial design so as to provide interconnection of at least one of the unused pads to a selected pad in the array that is used for connection to the core circuitry, thereby enhancing ESD protection of the core circuitry connected to the selected pad.

12. A method of designing an ASIC according to claim 11 wherein the selected pad is adjacent a corner of the ASIC chip.

13. A method of designing an ASIC according to claim 11 wherein the said one of the unused pads is immediately adjacent to the selected pad.

14. A method of designing an ASIC according to claim 11 wherein said modifyig step includes modifying a metal layer in the initial design of the ASIC, whereby no extra processing steps are required to connect the unused pad to the selected pad during fabrication.

15. A method of designing an ASIC according to claim 11 wherein the unused pad is spaced apart from the selected pad.

* * * * *